United States Patent
Lee

(10) Patent No.: US 7,741,135 B2
(45) Date of Patent: Jun. 22, 2010

(54) METHOD OF MANUFACTURING LIGHT EMITTING DISPLAY

(75) Inventor: Kwan Hee Lee, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 386 days.

(21) Appl. No.: 11/388,335

(22) Filed: Mar. 23, 2006

(65) Prior Publication Data

US 2006/0220056 A1 Oct. 5, 2006

(30) Foreign Application Priority Data

Mar. 30, 2005 (KR) .................... 10-2005-0026768

(51) Int. Cl.
*H01L 21/00* (2006.01)

(52) U.S. Cl. .................. 438/30; 438/116; 438/155; 438/455; 257/E23.002; 257/E23.126; 257/E23.129; 257/E23.134; 349/152

(58) Field of Classification Search .............. 438/25–30, 438/115, 757, 906, 116, 127, 149, 151, 152, 438/155, 455, 456, 164, 611, 745, 751, 459, 438/126; 257/81–83, 100, 290, 292, 687, 257/701, 704, E51.006, E51.018–E51.02, 257/E51.022, E33.056, E33.058, E33.059, 257/E23.002, E23.116, E23.123–E23.124, 257/E23.126, E23.129, 98, 702, 735, 787, 257/E33.06, E33.064, E23.015, E23.134; 313/500, 512; 349/122, 138, 149, 150, 151, 349/152

See application file for complete search history.

(56) References Cited

U.S. PATENT DOCUMENTS 6,248,704 B1 * 6/2001 Small et al. ................ 510/176

(Continued)

FOREIGN PATENT DOCUMENTS

CN 1320971 A 11/2001

(Continued)

OTHER PUBLICATIONS

Korean Patent Abstracts, Publication Number: 1020040037663 A; Publication Date: May 7, 2004; in the name of Sang Rae Cho.

(Continued)

*Primary Examiner*—Matthew C Landau
*Assistant Examiner*—Joseph C Nicely
(74) *Attorney, Agent, or Firm*—Christie, Parker & Hale, LLP

(57) ABSTRACT

A method of manufacturing a light emitting display including an image display part formed on a substrate and a pad part including at least one terminal electrically connected to the image display part. The method includes forming thin film transistors and at least one electroluminescent device electrically connected to the thin film transistors and including a first electrode layer, an emission layer, and a second electrode layer on the image display part, forming a protection layer on the second electrode layer of the electroluminescent device and the pad part, sealing the image display part on the protection layer, and removing the protection layer formed at least on the pad part to expose the terminals. Therefore, it is possible to easily remove the protection layer formed of organic material or inorganic material formed on the pad part without an additional mask.

12 Claims, 5 Drawing Sheets

U.S. PATENT DOCUMENTS

| | | |
|---|---|---|
| 6,476,988 B1 | 11/2002 | Yudasaka |
| 6,503,770 B1 * | 1/2003 | Ho et al. ............... 438/22 |
| 6,830,494 B1 * | 12/2004 | Yamazaki et al. ......... 445/24 |
| 6,849,877 B2 * | 2/2005 | Yamazaki et al. ......... 257/86 |
| 7,129,163 B2 * | 10/2006 | Sherrer et al. ........... 438/637 |
| 7,264,979 B2 * | 9/2007 | Yamagata et al. ......... 438/26 |
| 7,439,539 B2 * | 10/2008 | Jeoung et al. ............ 257/59 |
| 2002/0180371 A1 | 12/2002 | Yamazaki et al. |
| 2002/0197823 A1 * | 12/2002 | Yoo et al. ............... 438/424 |
| 2003/0129298 A1 * | 7/2003 | Tera et al. .............. 427/66 |
| 2004/0061434 A1 | 4/2004 | Mori et al. |
| 2004/0137142 A1 | 7/2004 | Nishikawa |
| 2004/0217704 A1 | 11/2004 | Iwase et al. |
| 2005/0045917 A1 | 3/2005 | Yamazaki et al. |
| 2006/0220551 A1 * | 10/2006 | Yamazaki ............... 313/512 |
| 2007/0205719 A1 * | 9/2007 | Kim ..................... 313/512 |
| 2008/0303408 A1 * | 12/2008 | Yamazaki et al. ......... 313/498 |
| 2009/0042326 A1 * | 2/2009 | Yamazaki et al. ......... 438/29 |

FOREIGN PATENT DOCUMENTS

| | | |
|---|---|---|
| CN | 1498039 A | 5/2004 |
| EP | 1 139 453 A2 | 10/2001 |
| JP | 2001-326362 | 11/2001 |
| JP | 2002-151254 | 5/2002 |
| JP | 2003-208975 | 7/2003 |
| JP | 2004-127637 | 4/2004 |
| JP | 2004-165068 | 6/2004 |
| JP | 2005-078946 | 3/2005 |
| KR | 1991-0019270 | 11/1991 |
| KR | 2001-0012714 | 2/2001 |
| KR | 10-2004-0004820 | 1/2004 |
| KR | 10-2004-0030356 | 4/2004 |
| KR | 2004-0037663 | 5/2004 |
| WO | WO 03/069957 A1 | 8/2003 |

OTHER PUBLICATIONS

European Search Report dated Jul. 24, 2006 for EP 06111735.4, in the name of Samsung SDI Co., Ltd.

Korean Patent Abstracts, Publication No. 1020040004820 A, dated Jan. 16, 2004, in the name of Gwan Su Kim et al.

Korean Patent Abstracts, Publication No. 1020040030356 A, dated Apr. 9, 2004, in the name of Takao Mori et al.

China Office action dated Jul. 6, 2007 for corresponding China application with English translation.

Office action dated Jan. 31, 2007, for corresponding Korean Patent Application No. 10-2005-0026768. (w/ English Translation).

Japanese Office action dated Dec. 9, 2008, for corresponding Japanese application 2005-299051, noting listed references in this IDS.

* cited by examiner

METHOD OF MANUFACTURING LIGHT EMITTING DISPLAY

CROSS-REFERENCE TO RELATED APPLICATIONS

This application claims priority to and the benefit of Korean Patent Application No. 10-2005-0026768, filed on Mar. 30, 2005, in the Korean Intellectual Property Office, the entire content of which is incorporated herein by reference.

BACKGROUND

1. Field of the Invention

The present invention relates to a light emitting display and a method of manufacturing the same, and more particularly to, a light emitting display capable of removing a protection layer formed on a pad part without using an additional mask and a method of manufacturing the same.

2. Discussion of Related Art

To manufacture a light emitting display, a semiconductor layer is formed by performing processes of providing a substrate, forming a buffer layer on the provided substrate, and forming an amorphous silicon layer on the buffer layer to crystallize the amorphous silicon layer. When the semiconductor layer is formed, a gate insulating layer is formed on the semiconductor layer, a metal layer is stacked on the gate insulating layer to form a gate electrode, and an interlayer insulating layer is formed on the gate electrode. After the interlayer insulating layer is formed, source and drain electrodes are formed on the interlayer insulating layer and an OLED is formed on the source and drain electrodes to be electrically connected to the source and drain electrodes.

In general, the OLED includes an anode electrode, an organic emission layer, and a cathode electrode. The anode electrode of the OLED is formed on the source and drain electrodes to be electrically connected to the source and drain electrodes. Next, the organic emission layer is formed on the anode electrode and the cathode electrode is formed on the organic emission layer. A passivation layer is formed on the cathode electrode in order to seal up the emission layer. When the passivation layer is used in order to seal up the emission layer, a terminal adjacent to the image display part of the light emitting display must be exposed for the module interface of the light emitting display. In order to expose the terminal, an additional mask or patterning process is required.

However, when the mask or the patterning process is used in order to expose the terminal, the increase in the components for arranging the mask to expose the electrode may make the equipment complicated. Also, because the mask for exposing the electrode is used, additional processes are required for providing the mask (such as cleansing, etching, and stripping processes) must be performed. Therefore, the number of processes increases so that productivity decreases.

SUMMARY OF THE INVENTION

A light emitting display capable of reducing the number of processes so that it is possible to improve productivity by performing processes simpler than conventional processes is provided and a method of manufacturing the same are provided.

According to an aspect of the present invention, there is provided a method of manufacturing a light emitting display including an image display part formed on a substrate and a pad part including at least one terminal electrically connected to the image display part. The method comprises forming thin film transistors and at least one electroluminescent device electrically connected to the thin film transistors including a first electrode layer, an emission layer, and a second electrode layer on the image display part, forming a protection layer on the second electrode layer of the electroluminescent device and the pad part, sealing the image display part on the protection layer, and removing the protection layer formed at least on the pad part to expose the terminals.

During the removing of the protection layer, the protection layer formed in the region excluding the sealing region is preferably removed together with the protection layer formed on the pad part.

The protection layer is formed of at least one of an inorganic layer and an organic layer. The thickness of the protection layer is selected in the range of 600 to 1,300 angstroms (Å). An angstrom is a unit of length equal to one hundred-millionth of a centimeter. During the exposing of the terminals, the protection layer is removed deeper than the selected thickness of the protection layer using an etching process.

During the removing of the protection layer, the etching process is wet etching. Buffer oxide etchant (BOE) is used during the wet etching.

The method further comprises a cleansing step after the protection layer is removed. In the cleansing step, cleansing solution including at least one from among a group including de-ionized water, alcoholic cleansing solution, and neutral detergent is used.

According to the second aspect of the present invention, there is provided a light emitting display including an image display part formed on a substrate and a pad part including at least one terminal electrically connected to the image display part, the light emitting display comprising thin film transistors formed on the image display part and at least one electroluminescent device electrically connected to the thin film transistors and including a first electrode layer, an emission layer, and a second electrode layer, a protection layer formed on the electroluminescent device and the pad part to expose the terminals, and a sealing panel formed on the image display part to surround the electroluminescent device.

BRIEF DESCRIPTION OF THE DRAWINGS

These and/or other aspects and features of the invention will become apparent and more readily appreciated from the following description of the embodiments, taken in conjunction with the accompanying drawings of which.

DETAILED DESCRIPTION

Figure 1:
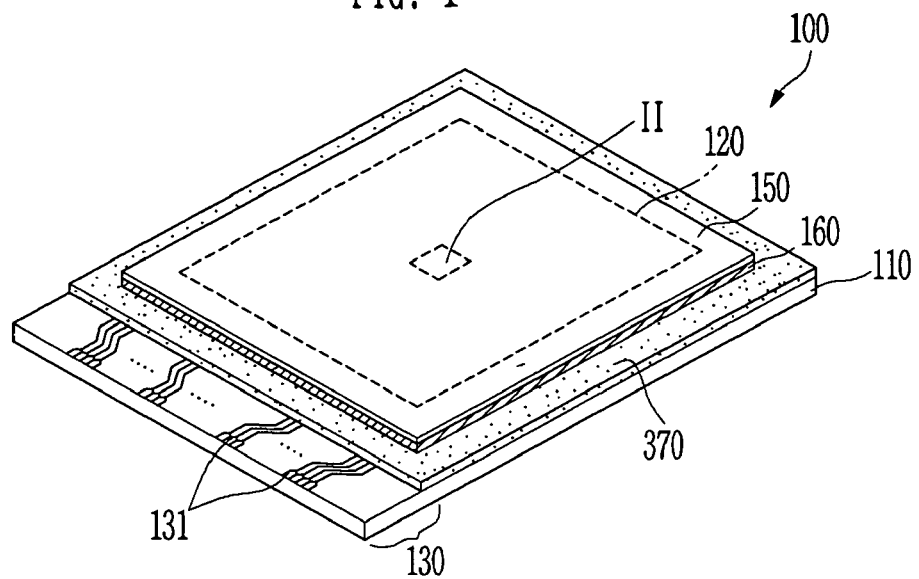
FIG. 1 is a schematic perspective view of a light emitting display according to an embodiment of the present invention.

FIG. 1 is a schematic perspective view of a light emitting display according to an embodiment of the present invention. Referring to FIG. 1, a light emitting display 100 includes an image display part 120 including at least one electroluminescent device formed on a substrate 110 and a pad part 130 formed in at least one side outside the image display part 120. The image display part 120 includes transistors, an electroluminescent device, a capacitor, and a power source line (refer to FIG. 2). The pad part 130 includes scan/data drivers (not shown) for transmitting scan and/or data signals to pixels that constitute the image display part 120 and one or more terminals 131 for providing electrical signals to the image display part 120. A panel 150 is formed on the image display part 120 so that the image display part 120 is enclosed between the substrate 110 and the panel 150. The panel 150 and the substrate 110 are sealed to each other using a sealing member 160.

Figure 2:
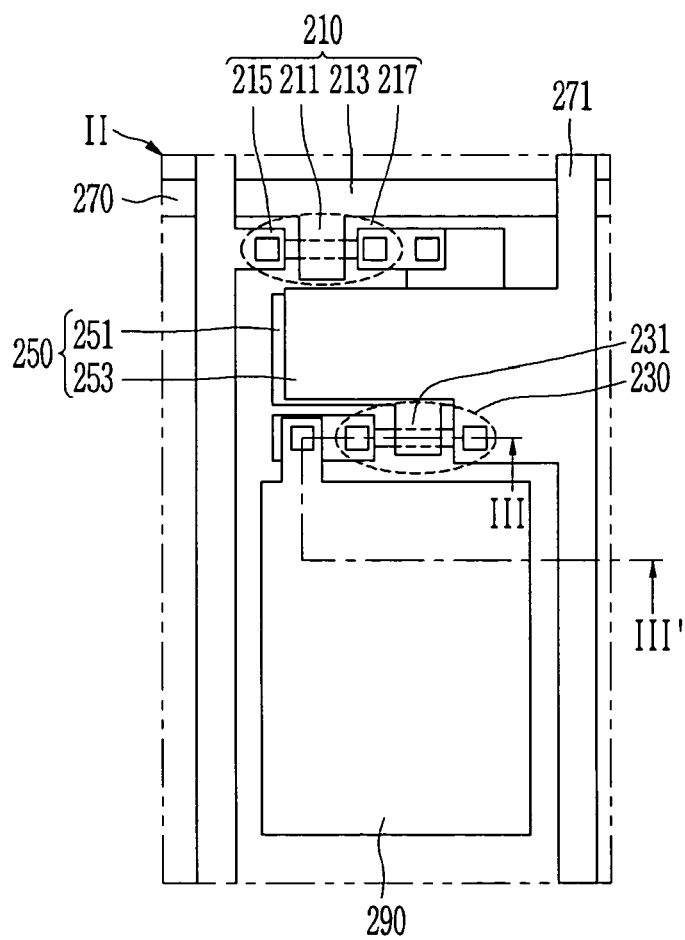
FIG. 2 schematically illustrates a pixel in the part II of the image display part of FIG. 1.

FIG. 2 schematically illustrates a pixel in part II of the image display part of FIG. 1. Referring to FIG. 2, the pixel includes two thin film transistors (TFT) 210 and 230 and a capacitor 250.

The first TFT 210 includes a gate electrode 211, a semiconductor layer 213, a source electrode 215, and a drain electrode 217. A data signal input through a data line 270 is transmitted from the source electrode 215 to the drain electrode 217 through the semiconductor layer 213. The extended part of the drain electrode 217 of the first TFT 210 is connected to the first electrode 251 of the capacitor 250. The other end of the first electrode 251 of the capacitor 250 forms the gate electrode 231 of the second TFT 230. The second electrode 253 of the capacitor 250 is electrically connected to a power source line 271 for supplying a power source.

Figure 3:
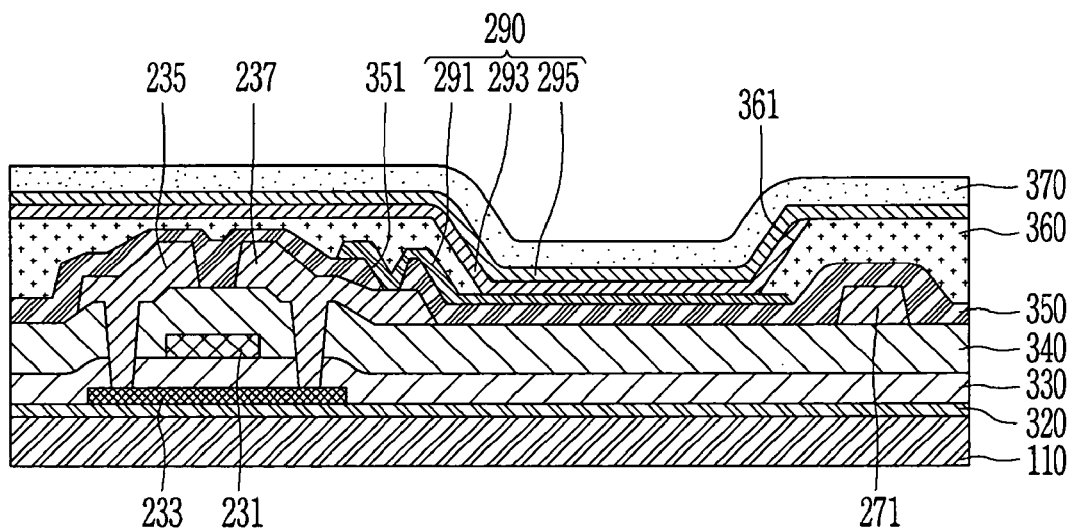
FIG. 3 is an enlarged side sectional view taken along the line III-III' of FIG. 2.

FIG. 3 is an enlarged side sectional view that is taken along the line III-III' of FIG. 2. In FIG. 3, the sections in which the second TFT 230 is arranged, the part in which an electroluminescent device 290 is arranged, and the power source line 271 for supplying power source are illustrated in detail.

A buffer layer 320 is formed on the substrate 110 and the semiconductor layer 233 of the second TFT 230 is formed on the buffer layer 320. The semiconductor layer 233 may be formed of an amorphous silicon layer or a polycrystalline silicon layer. The semiconductor layer 233 commonly includes of source and drain regions doped with n+ or p+ type dopants and a channel region that is not shown in the present embodiment. The gate electrode 231 of the second TFT 230 is formed on the semiconductor layer 233 and a gate insulating layer 330 for insulating the semiconductor layer 233 and the gate electrode 231 from each other is formed between the semiconductor layer 233 and the gate electrode 231. An interlayer insulating layer 340 is formed on the gate insulating layer 330 and the gate electrode 231. The source/drain electrodes 235 and 237 of the second TFT 230 are formed on the interlayer insulating layer 340 so that the source/drain electrodes 235 and 237 are electrically connected to the semiconductor layer 233.

A passivation layer 350 for protecting and/or planarizing the source/drain electrodes 235 and 237 is formed on the source/drain electrodes 235 and 237. The first electrode layer (anode electrode) 291 of the electroluminescent device 290 is formed on the passivation layer 350. The first electrode layer 291 is electrically connected to the source/drain electrodes 235 and 237 through a via hole 351 formed in the passivation layer 350. The first electrode layer 291 may be formed of a transparent electrode or a reflection electrode and a transparent electrode in accordance with top or bottom surface emission. The passivation layer 350 may be formed of inorganic or organic material as a single layer or a multi-layer. A pixel defining layer 360 in which an aperture 361 for at least partially exposing the first electrode layer 291 is formed on the passivation layer 350 and the first electrode layer 291 of the electroluminescent device 290.

An emission layer 293 is formed on the first electrode layer 291 exposed through the aperture 361. The emission layer 293 may be formed of a low molecule or high molecule organic film. When the emission layer 293 is formed of the low molecule organic film, the emission layer 293 may be used as a hole injecting layer (HIL), a hole transfer layer (HTL), an organic emission layer (EML), an electron transfer layer (ETL), and an electron injecting layer (EIL). When the emission layer 293 is formed of the high molecule organic film, the emission layer 293 may be commonly used as the HTL and the EML. A second electrode layer (cathode electrode) 295 is formed on the emission layer 293. In general, the second electrode layer 295 is deposited on the entire surface. However, it is not limited to the above. The second electrode layer 295 may be formed of Al, Ca, MgAg, Ag, and ITO in different manners in accordance with emission type.

On the other hand, a protection layer 370 for protecting the image display part 120 is formed on the second electrode layer 295. The protection layer 370 may be formed of organic material other than inorganic material such as $SiO_2$ and SiNx and may be formed of a single layer or a double layer including a SiNx layer in the lower part and an organic layer such as benzocyclobutene and acryl in the upper part. The thickness of the protection layer 370 may be selected in the range of 600 to 1,300 Å. According to the present embodiment, the protection layer 370 has one layer (such as $SiO_2$). However, it is not limited to the above. The protection layer 370 may be formed of a plurality of layers and may have various structures.

FIGS. 4A to 4D are plan views of a light emitting display that schematically illustrate processes of removing the protection layer formed on the image display part of the light emitting display according to one embodiment.

Figure 4A:
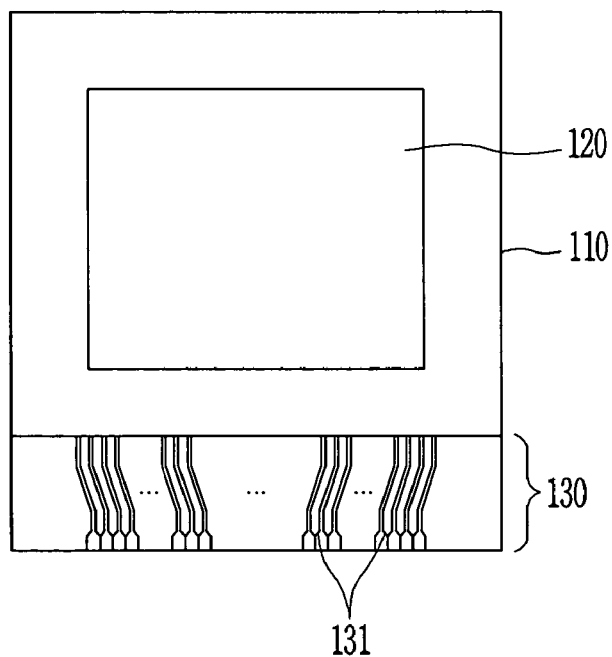
FIGS. 4A to 4D are plan views of a light emitting display that schematically illustrate processes of removing a protection layer formed on an organic light emitting diode (OLED) according to one embodiment.
Figure 4B:
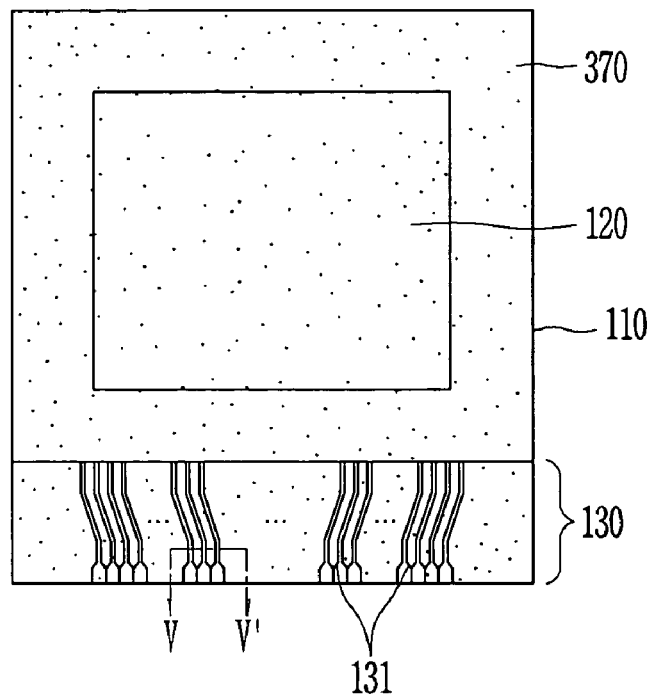

Referring to FIGS. 4A and 4B, the light emitting display 100 includes the image display part 120 formed on the substrate 110 and the pad part 130 including the plurality of terminals 131. The protection layer 370 is formed on the image display part 120 including the electroluminescent device 290 (refer to FIG. 3) formed on the substrate 110. The protection layer 370 is also formed on the pad part 130 of the light emitting display 100. That is, the protection layer 370 is formed on the entire surface of the substrate 110.

Figure 4C:
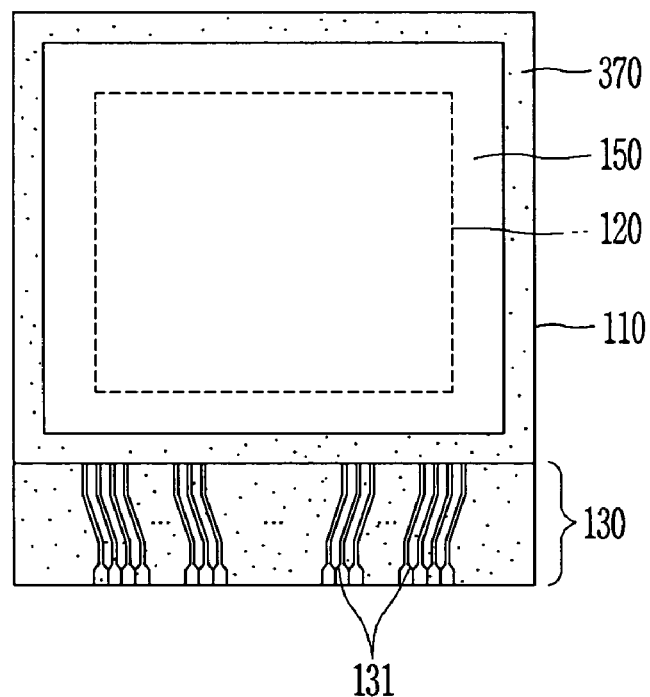
Figure 4D:
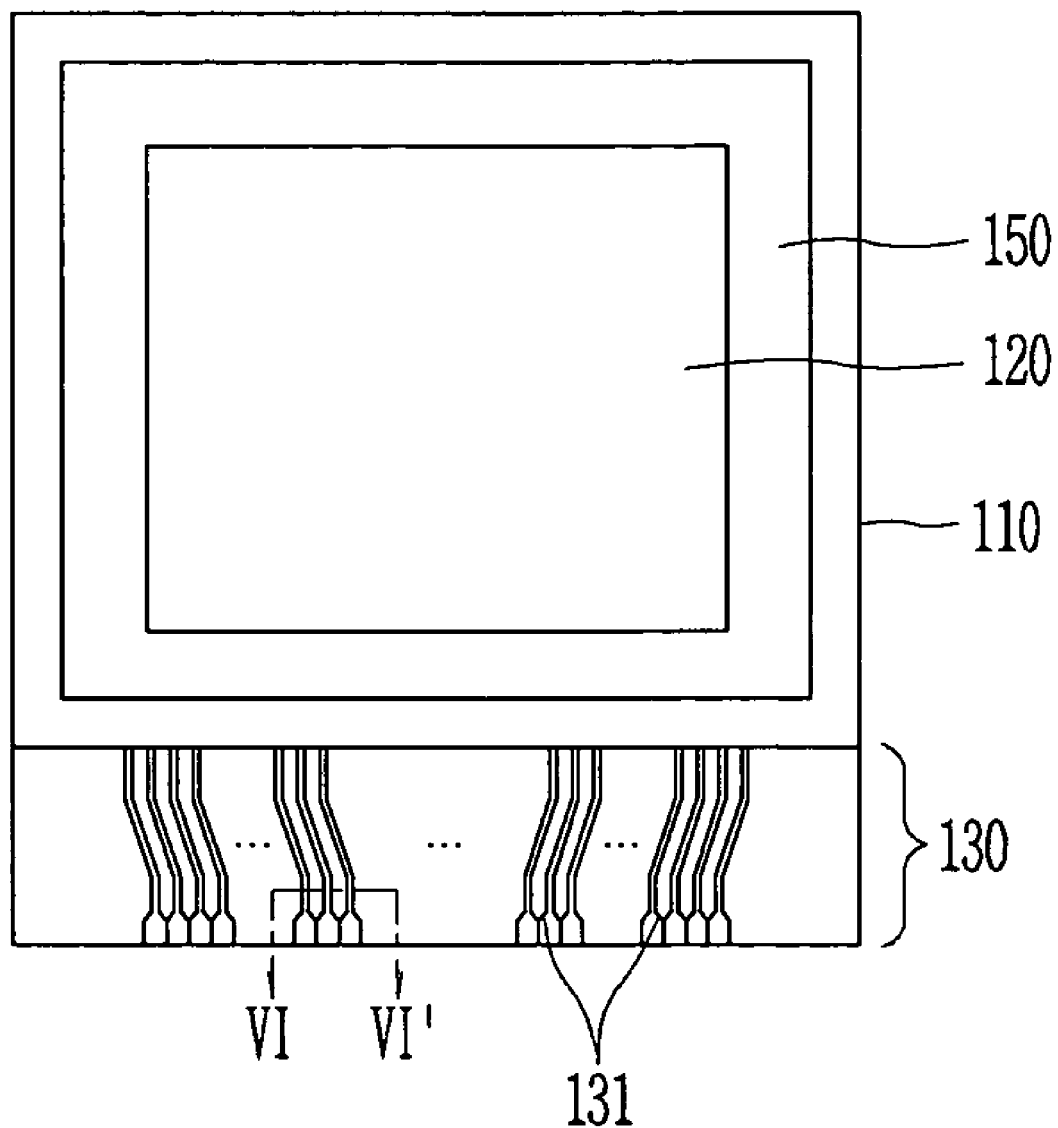

Referring to FIG. 4C, after the protection layer 370 is formed on the image display part 120 and the pad part 130, the sealing panel 150 formed to surround the image display part 120 is provided on the image display part 120 to seal the image display part 120. Referring to FIG. 4D, after the sealing panel 150 is provided on the image display part 120, the protection layer 370 formed on the pad part 130 is removed using the sealing panel 150 as a mask. The protection layer 370 formed outside the sealed region, that is, the areas on the substrate 110 around the panel 150, including the pad part 130, is removed from each of these areas simultaneously. No less than the selected thickness of the protection layer 370 is removed from the protection layer 370 formed outside the sealing region.

Hereinafter, the side sectional structures of the pad part region in which the protection layer is formed and the pad part region from which the protection layer is removed will be described in detail with reference to the attached drawings. First, the pad part region in which the protection layer is formed will be described.

Figure 5A:
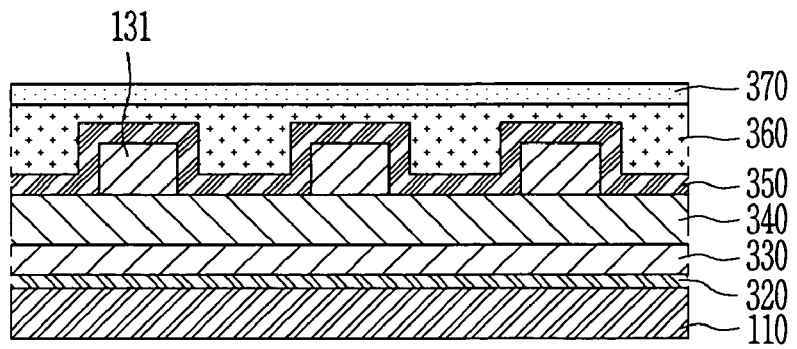
FIG. 5A is a partially enlarged side sectional view of an embodiment of a pad part region that is taken along the line V-V' of FIG. 4B.
Figure 5B:
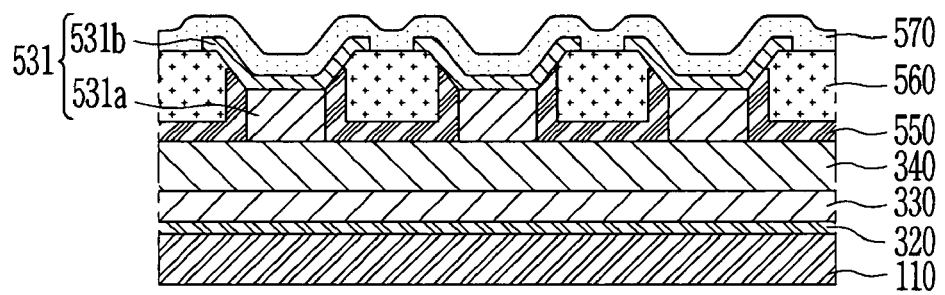
FIG. 5B is a partially enlarged side sectional view of another embodiment of the pad part region that is taken along a line equivalent to V-V' of FIG. 4B.

FIG. 5A is a partially enlarged side sectional view of the pad part region taken along the line of V-V' of FIG. 4B according to an embodiment. FIG. 5B is a partially enlarged side sectional view of a pad part region taken along a line equivalent to V-V' of FIG. 4B according to another embodiment.

Referring to FIG. 5A, the pad part 130 includes the buffer layer 320 formed on the substrate 110, the gate insulating layer 330, the interlayer insulating layer 340, the terminal units 131, the passivation layer 350, the pixel defining layer 360, and the protection layer 370. To be specific, the gate insulating layer 330 is formed on the buffer layer 320 and the interlayer insulating layer 340 is formed on the gate insulating layer 340. In general, since the terminal units 131 are formed together with source and drain electrodes 235 and 237 when the source and drain electrodes 235 and 237 are formed, the terminal units 131 are formed on the interlayer insulating layer 340. The passivation layer 350, the pixel defining layer 360, and the protection layer 370 are sequentially stacked on the terminal units 131 and the interlayer insulating layer 340.

Referring to FIG. 5B, the pad part 130 according to the present embodiment includes the buffer layer 320 formed on the substrate 110, the gate insulating layer 330, the interlayer insulating layer 340, terminal units 531a and 531b, the passivation layer 550, the pixel defining layer 560, and the protection layer 570. To be specific, the gate insulating layer 330 is formed on the buffer layer 320 and the interlayer insulating layer 340 is formed on the gate insulating layer 330. According to the present embodiment, each of the terminal units 531 includes a first terminal unit 531a formed together with the source and drain electrodes 235 and 237 when the source and drain electrodes 235 and 237 are formed and a second terminal unit 531b formed together with an anode electrode.

The first terminal units 531a are formed on the interlayer insulating layer 340. The passivation layer 550 and the pixel defining layer 560 are formed on the first terminal units 531a and the interlayer insulating layer 340. The second terminal units 531b are formed on the pixel defining layer 560 to be electrically connected to the first terminal units 531a. According to such a structure, the protection layer 570 is formed on the second terminal units 531b.

Figure 6A:
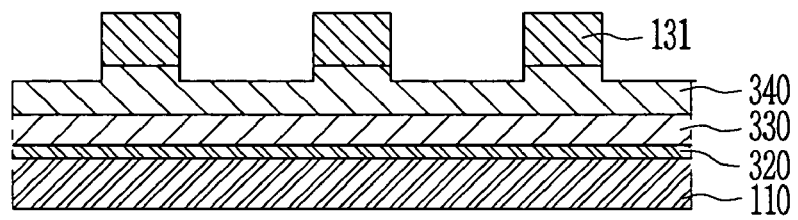
FIG. 6A is a partially enlarged side sectional view of an embodiment of a pad part region that is taken along the line VI-VI' of FIG. 4D.
Figure 6B:
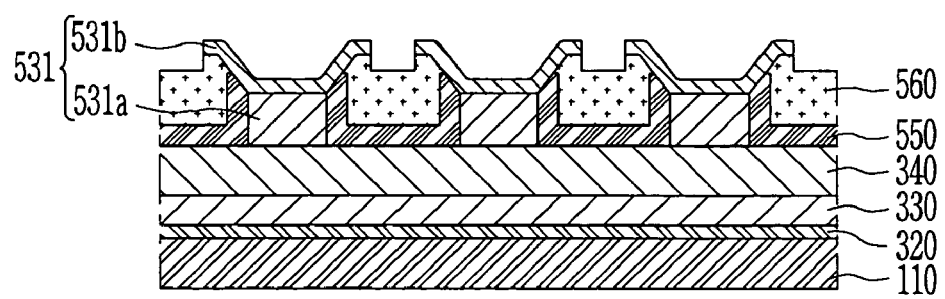
FIG. 6B is a partially enlarged side sectional view of another embodiment of the pad part region that is taken along a line equivalent to VI-VI' of FIG. 4D.

FIG. 6A is a partially enlarged side sectional view of the pad part region taken along the line VI-VI' of FIG. 4D according to an embodiment. FIG. 6B is a partially enlarged side sectional view of the pad part region taken along a line equivalent to VI-VI' of FIG. 4D according to another embodiment.

Referring to FIGS. 6A and 6B, the protection layer 370, 570 formed on the terminal units 131, 531 is removed to expose the terminal units 131, 531. According to one embodiment, in order to remove the protection layer 370, 570, etching, in particular, wet etching is performed on the protection layer 370, 570 using reactant material that reacts to the protection layer 370, 570 formed of $SiO_2$ and $SiN_x$. To be specific, when wet etching is performed on the protection layer 370, 570 formed of $SiO_2$, a solvent such as hydrogen fluoride (HF) diluted to predetermined density may be used.

In general, etching rates vary with the degree of dilution of HF. When the etching rate is excessively high, it is difficult to control an etching process. Therefore, in order to prevent the etching rate from being excessively high, buffered oxide etchant (BOE) that is diluted such as buffered HF is used.

Next, in order to remove the etching solvent that resides on the pad part 130, a cleansing process is performed. In the cleansing process, a cleansing solution including at least one among de-ionized water, an alcoholic cleansing solution, and a neutral detergent is used. In FIGS. 6A and 6B, the protection layer 370, 570 is removed using the wet etching process and the terminal units 131, 531 formed in the pad part 130 are exposed. On the other hand, when the protection layer 370, 570 formed on the pad part 130 is etched, the protection layer 370, 570 is etched deeper than the deposition thickness of the protection layer 370, 570 selected in the range of 600 to 1,300 Å so that it is possible to prevent the protection layer 370, 570 from residing on the terminal units 131, 531. On the other hand, in FIG. 6A, the etching process is performed so that the passivation layer 350 and the pixel defining layer 360 are removed together with the protection layer 370.

According to the above-described embodiments, the multi-layer terminal units, in which the source and drain electrodes are formed together with the terminal units, the source and drain electrodes are formed together with the first terminal units, and the anode electrode are formed together with the second terminal units, are disclosed. However, the terminal units may be formed using the gate electrode. When the terminal units are formed using the gate electrode, it is also possible to form the multi-layer terminal units as well as the single layer terminal units.

The embodiments of the present invention are not limited to the above-described embodiments. According to the above-described embodiments, an AM driving type organic field emission display is disclosed. However, various modifications such as an inorganic field emission display and a PM driving type organic field emission display may be obtained.

According to the above-described embodiments, an example in which the protection layer formed of $SiO_2$ is wet etched was described in detail. However, different etching solutions may be used in accordance with inorganic material and organic material.

Also, according to the above-described embodiments, the example in which the first electrode layer is used as the anode electrode was disclosed. However, the embodiments of the present invention are not limited to the above and the first electrode layer may be used as a cathode electrode layer.

As described above, according to the embodiments of the present invention, the protection layer may be formed on the image display part and the pad part so that it is possible to easily protect the second electrode of the electroluminescent device.

Also, after the panel for sealing the image display part is formed on the image display part where the protection layer is formed, the protection layer formed on the pad part may be removed. Therefore, an additional mask is not required so that it is possible to significantly reduce the number of manufacturing processes. Since the number of masks is reduced, it is also possible to reduce the complex processes used in the respective mask steps (such as cleansing, etching, and strip processes). As a result, it is possible to reduce manufacturing expenses and to improve productivity.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a light emitting display including an image display part and a pad part on a substrate, the pad part including at least one terminal electrically connected to the image display part, the method comprising:
   forming thin film transistors and at least one electroluminescent device electrically connected to the thin film transistors, the at least one electroluminescent device including a first electrode layer, an emission layer, and a second electrode layer on the image display part;
   forming a protection layer on the second electrode layer of the electroluminescent device and the pad part;
   sealing the protection layer on the image display part with a sealing panel; and
   removing the protection layer and at least a portion of at least one further layer below the at least one terminal from at least the pad part by utilizing a wet etching process to expose the at least one terminal, wherein the sealing panel is utilized as a mask during the wet etching process.

2. The method of claim 1, wherein the protection layer is formed of an inorganic layer and/or an organic layer.

3. The method of claim 2, wherein a thickness of the protection layer is in the range of 600 to 1,300 Å.

4. The method of claim 1, wherein a buffer oxide etchant (BOE) is utilized during the wet etching process.

5. The method of claim 4, further comprising:
   cleansing after the protection layer and the at least a portion of the at least one further layer below the at least one terminal are removed.

6. The method of claim 5, wherein a cleansing solution comprising de-ionized water, an alcoholic cleansing solution, and/or a neutral detergent is utilized during the cleansing.

7. The method of claim 1, further comprising:
   cleansing after the protection layer and the at least a portion of the at least one further layer below the at least one terminal are removed.

8. The method of claim 1, wherein the at least the pad part is in a region other than the sealed region.

9. A method of forming a light emitting display comprising:
   forming a thin film transistor and an electroluminescent device electrically connected to the thin film transistor in an image display part;
   forming a protection layer over the image display part and a pad part including at least one terminal coupled to the image display part after the thin film transistor and the electroluminescent device are formed;
   sealing the image display part with a sealing panel after the protection layer is formed, the image display part including the thin film transistor and the electroluminescent device; and
   removing the protection layer and at least a portion of at least one further layer below the at least one terminal from at least the pad part by utilizing a wet etching process after the image display part is sealed, wherein the sealing panel is utilized as a mask during the wet etching process.

10. The method of claim 9, further comprising;
    performing a cleansing process after the protection layer and the at least a portion of the at least one further layer below the at least one terminal are removed.

11. The method of claim 9, wherein the protection layer is formed with a thickness of 600 to 1,300 Å.

12. The method of claim 9, wherein the protection layer is formed of an inorganic layer and/or an organic layer.

* * * * *